United States Patent [19]
Ueno et al.

[11] Patent Number: 5,890,058
[45] Date of Patent: Mar. 30, 1999

[54] ELECTRONIC CIRCUIT AND FILTER DEVICE USING SAME

[75] Inventors: Takashi Ueno, Yokohama; Tetsuro Itakura, Nerima-ku; Hiroshi Tanimoto, Kawasaki, all of Japan

[73] Assignee: Kabushiki Kaisha Toshiba, Kawasaki, Japan

[21] Appl. No.: 715,345

[22] Filed: Sep. 18, 1996

[30] Foreign Application Priority Data

Sep. 18, 1995 [JP] Japan ................................. 7-237993

[51] Int. Cl.⁶ .................................................. H04B 1/40
[52] U.S. Cl. .......................... 455/73; 455/338; 333/217; 330/109
[58] Field of Search .................... 333/217; 327/552, 327/558; 330/107, 109, 303; 455/73, 338, 324, 76, 82, 83, 84

[56] References Cited

U.S. PATENT DOCUMENTS

| | | | |
|---|---|---|---|
| 3,879,675 | 4/1975 | Löfmark | 330/109 |
| 3,886,469 | 5/1975 | Rollett et al. | 330/107 |
| 3,919,658 | 11/1975 | Friend | 330/109 |
| 3,950,711 | 4/1976 | Ohkawa | 330/107 |
| 4,158,824 | 6/1979 | Wouters et al. | 330/109 |
| 4,437,067 | 3/1984 | McKenzie et al. | 327/552 |
| 4,439,693 | 3/1984 | Lucas et al. | 327/552 |
| 4,783,635 | 11/1988 | Sevastopoulos . | |
| 5,511,236 | 4/1996 | Umstattd et al. | 455/76 |

OTHER PUBLICATIONS

R. E. Massara, "FDNR realisation of all–pole LPF", IEE Proc., vol. 128, pt. G, No. 4, pp. 195–197, Aug. 1981.

*Primary Examiner*—Nguyen Vo
*Attorney, Agent, or Firm*—Foley & Lardner

[57] ABSTRACT

In an FDNR type active filter fabricated on an integrated circuit, an FDNR circuit is provided wherein one ends of a first capacitor and an impedance element are connected to an inverted input of an operational amplifier, one ends of the impedance element and a second capacitor are connected to an output end of the operational amplifier, and the other ends of the first and second capacitors are connected to each other. To the impedance element, resistors are connected in series. To the connecting end of the resistors, one end of another resistor is connected, the other end thereof being grounded in an alternating current form. The capacity value of the second capacitor is greater than that of the first capacitor.

6 Claims, 16 Drawing Sheets

$D = C1 \cdot C2 \cdot R0, \quad C = C1 + C2$

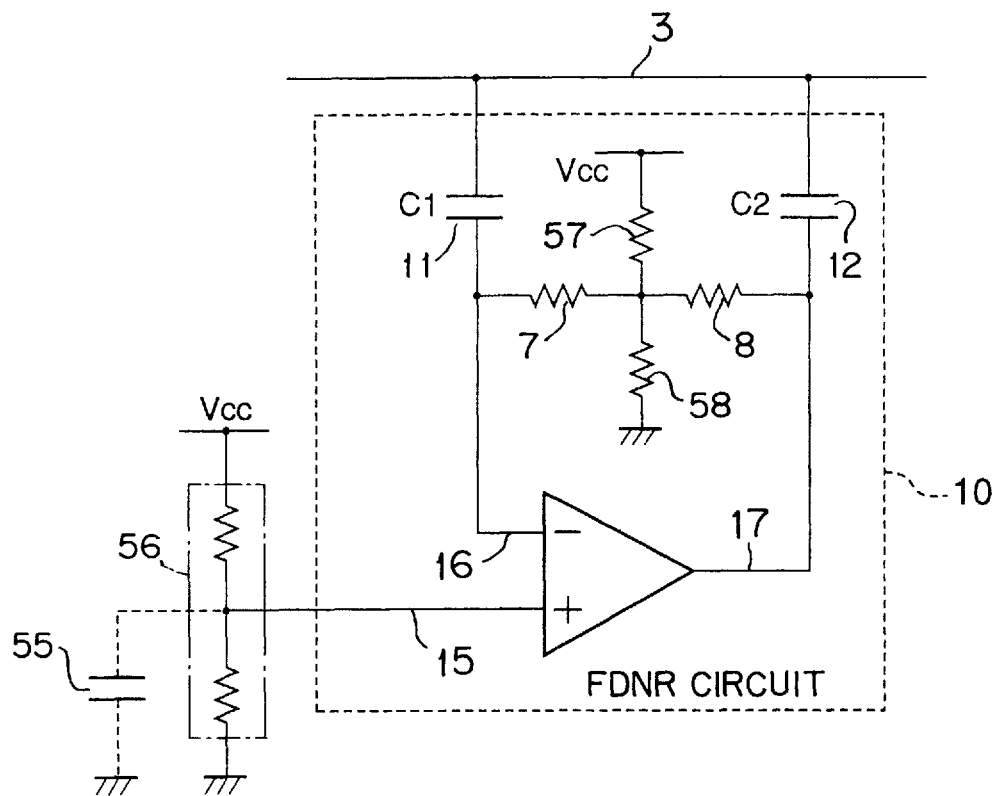
F I G. 11

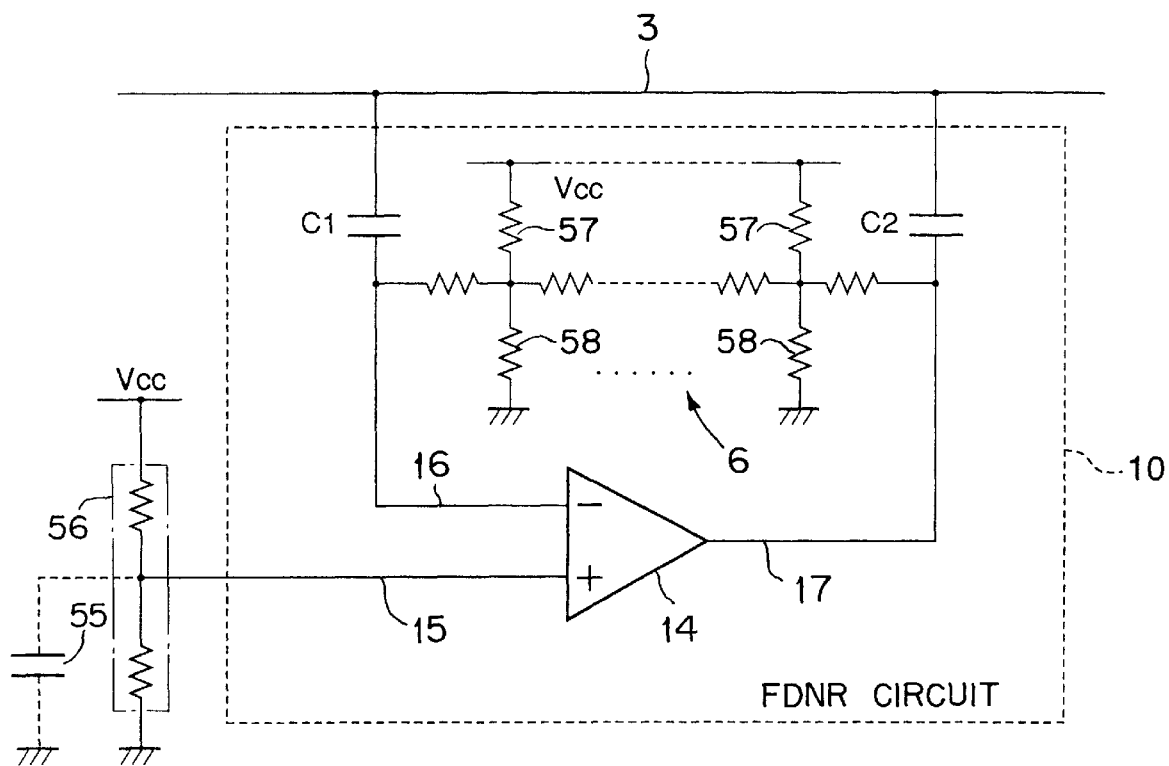
F I G. 12

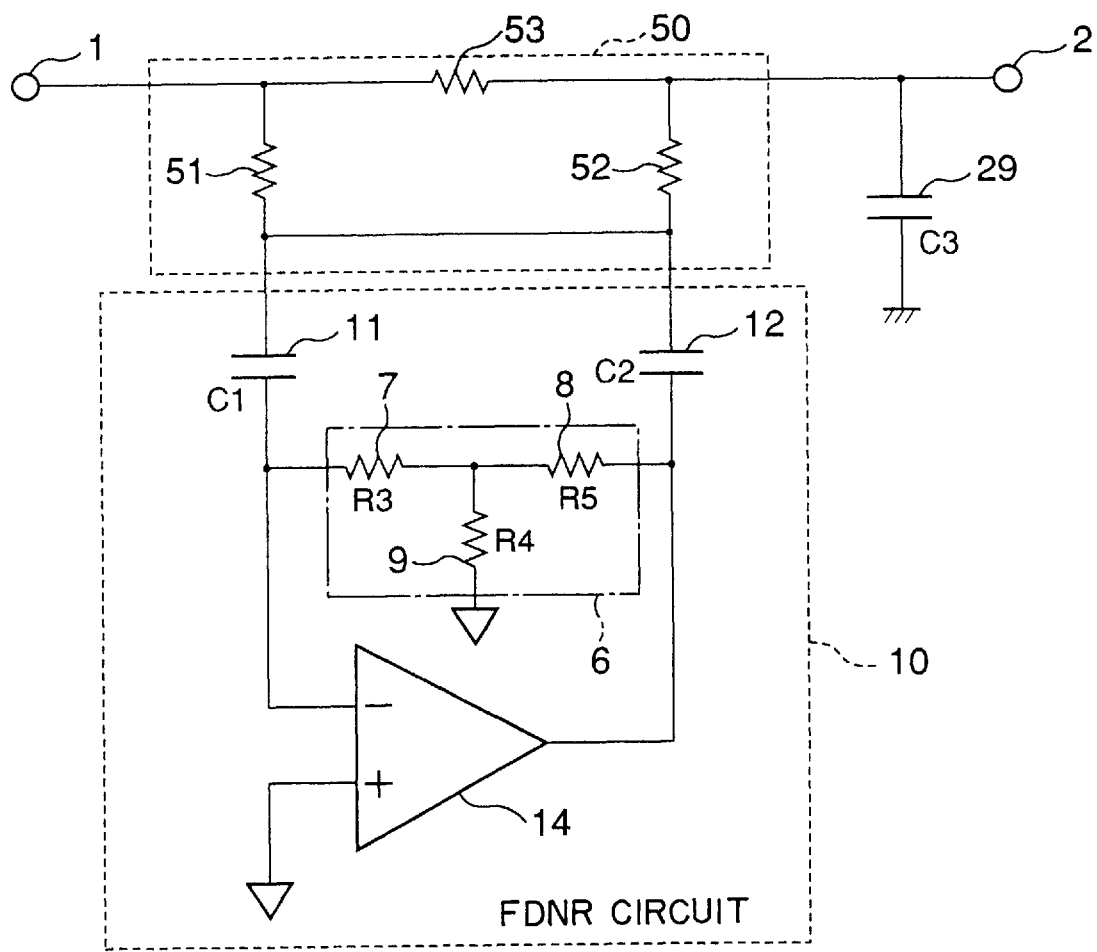
F I G. 13

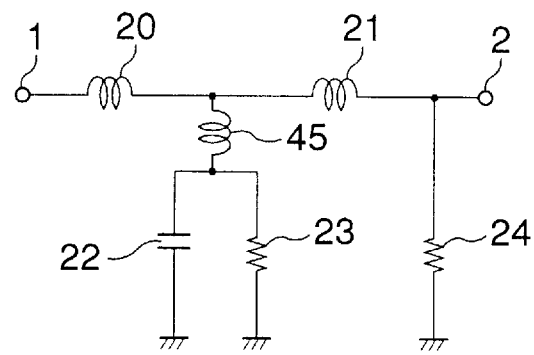
F I G. 14 A
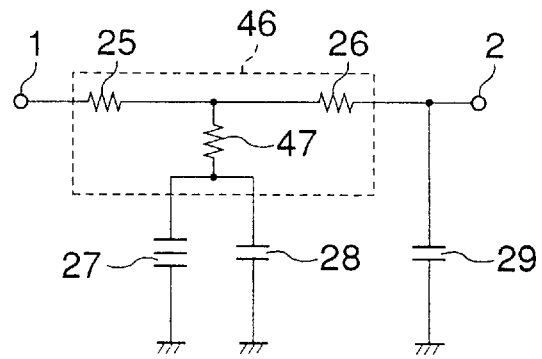
F I G. 14 B
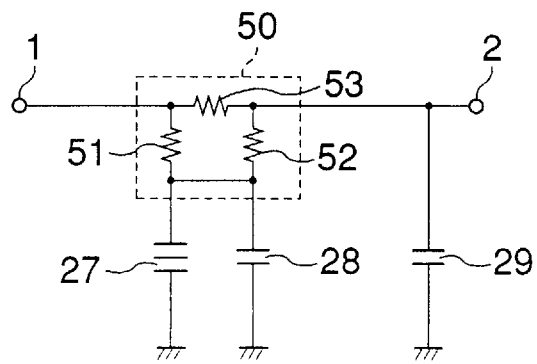
F I G. 14 C

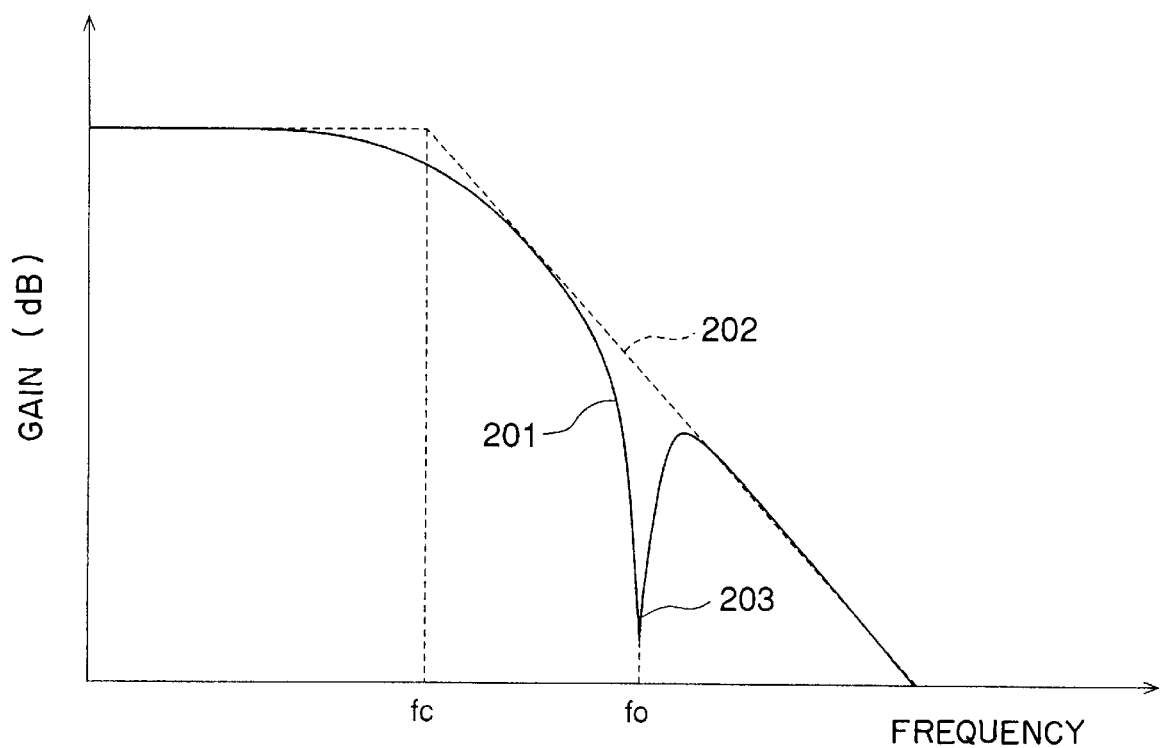
F I G. 15

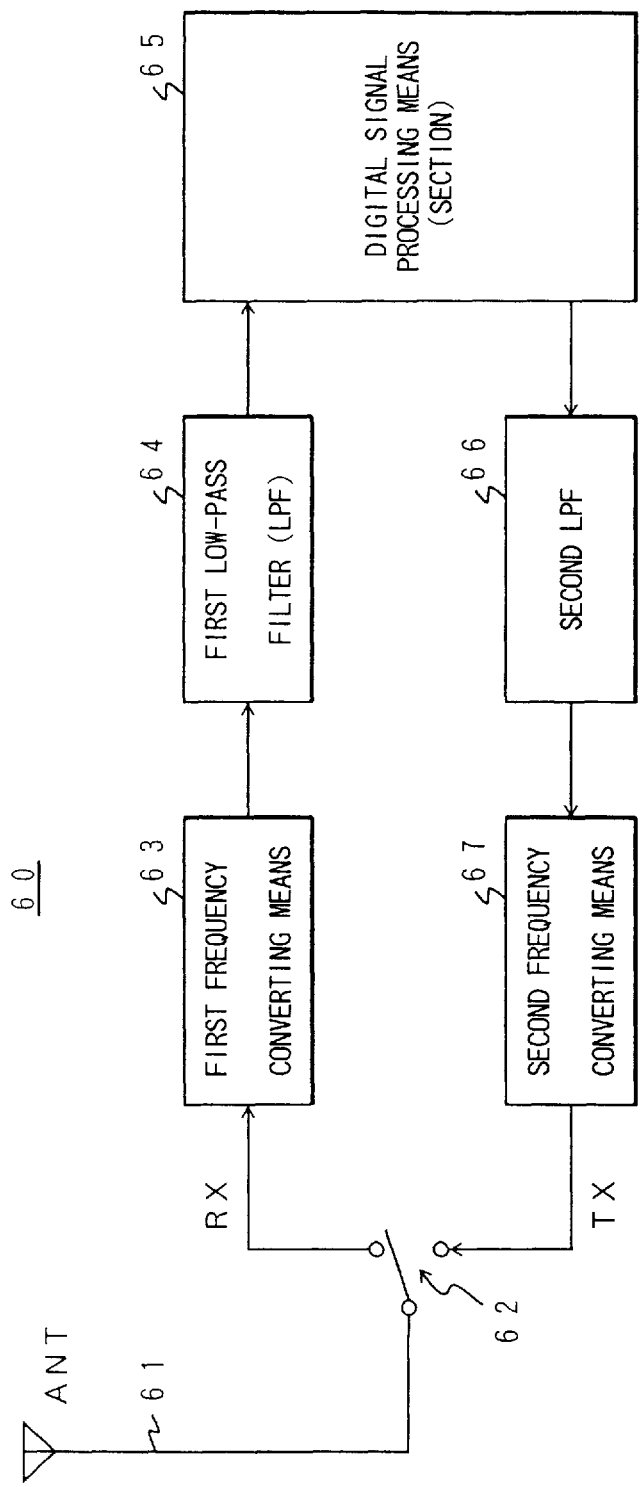
F I G. 16

ELECTRONIC CIRCUIT AND FILTER DEVICE USING SAME

BACKGROUND OF THE INVENTION

The present invention relates to an electronic circuit fabricated as an analogue integrated circuit, and a filter device using the same. More specifically, the invention relates to an electronic circuit such as a frequency-dependent negative resistance (FDNR) circuit and a filter device using the same.

In a case where a filter is fabricated on an integrated circuit, it is possible to realize a filter circuit having no inductor by using an active element. As methods for realizing this, there have been proposed various method, such as a method for using a feedback circuit based on an operational amplifier and a method for using a Gm amplifier.

As one of the design procedures of an active filter, there is a method for carrying out the equivalent conversion using capacitors, active elements and resistors from a ladder-type filter circuit comprising inductance, capacitors and resistors. For example, as shown in FIG. 1, there is a method for carrying out the equivalent conversion into a frequency-dependent negative resistor (FDNR) R called Ford-Girling circuit, and a capacitor C (see IEEE PROC. Vol.128, Pt.G. No. 4, pp.195–197).

FIG. 1 is a circuit diagram illustrating an FDNR conversion. In FIG. 1, the reference number 3 denotes a connecting point at which capacitors C1 and C2 are connected, the reference number 11 denotes a first capacitor (C1), the reference number 12 denotes a second capacitor (C2) and the reference number 13 denotes a first resistor (R0). On the opposite side of the connecting point 3 of the capacitors C1 and C2, the first resistor 13 and an operational amplifier 14 are connected to each other in parallel. The operational amplifier 14 has a positive input, which is connected to an earth terminal 15, a negative input, to which an inverted input 16 is supplied, and an output 17.

FIG. 2 illustrates an example of a tertiary low-pass filter realized using this equivalent conversion. In FIG. 2, resistors 25 and 26 obtained by the equivalent conversion are connected in series between an input terminal 1 and an output terminal 2, and a capacitor 29 obtained by the equivalent conversion is connected in parallel between the resistor 26 and the output terminal 2. Between the resistors 25 and 26, an FDNR circuit 10 is connected in parallel. This FDNR circuit 10 comprises first and second capacitors 11 and 12, each of which is connected in parallel between the input terminal 1 and the output terminal 2, a first resistor 13 provided between one ends of the respective capacitors 11 and 12, and an operational amplifier 14 connected to the first resistor 13 in parallel. The operational amplifier 14 has a positive input connected to an earth terminal 15, an inverted input 16 connected to one ends of trip first capacitor 11 and the first resistor 13, and an operation output 17 connected to one end of the second capacitor 12 and the other end of the first resistor 13. In an LCR ladder-type filter as shown in FIG. 3A, this is converted into a constitution which does not have L as shown in FIG. 3B, i.e. a form obtained by dividing the original ladder-type filter by s. As a result, the inductance is converted into a resistor, the resistor is converted into a capacitor, and the capacitor is converted into an FDNR (a term having s-2 if it is an impedance).

Although the FDNR itself does not exist in a passive element, it is possible to equivalently realize an FDNR using an active element as shown in FIG. 1. The feature of this filter circuit is that a DC path between the input and output of an operational amplifier, which forms the input and output paths and the FDNR, is completely interrupted. If a filter is formed by this FDNR, a DC offset voltage produced in the operational amplifier does not appear at the filter output, so that it is possible to design the filter independently of the DC offset produced in the operational amplifier when the filter is designed. Since the DC offset serves as a false input to deteriorate the S-N ratio of the filter, this is an extremely preferred characteristic for a low-pass filter. In addition, it is possible to independently deal with the DC voltage of the operational amplifier and the DC potential in the signal path, so that the degree of freedom in the circuit design is greatly increased.

Although the aforementioned circuit has many advantageous effects as set forth above, there are the following problems. Although the gain itself in the passing band of this filter is 0 dB, there is a signal gain, for example, of several dD to tens dB, in the output of the operational amplifier forming the FDNR. For that reason, in a case where a relatively large level of signal is processed by a low supply voltage, there is disadvantage in that the signal level at the output of the operational amplifier exceeds the working output range of the operational amplifier, so that the signal is distorted On the other hand, in a case where this filter is used in a low frequency band such as a base band of a radio transmitter-receiver (from tens to hundreds kHz), the element value forming the filter is increased, and in particular, there is a disadvantage when considering the fabrication of integrated circuits.

That is, the condition of equivalent conversion of the FDNR value D can be expressed by the following formula.

$$D = C1 \cdot C2 \cdot R0 \tag{1}$$

In a case where an integrated circuit is fabricated, the capacity values C1 and C2 used after the equivalent conversion must be capacity values which can be realized on the integrated circuit, and they can not be so increased for certain reasons of the occupied areas. If the value D is constant, the value R0 is derived by dividing the value D by the values C1 and C2 (these values are also realizable values: about tens pF), and the derived value R0 is a high resistance which is greater than hundreds kΩ. If this resistor is realized on an integrated circuit, the occupied area is extremely great. In addition, as shown in FIG. 4, in a resistor fabricated in an integrated circuit, a parasitic capacity of several pF to tens pF is distributed to an IC substrate and so forth. Since this resistor forms a negative feedback loop of the operational amplifier, this parasitic capacity causes a phase delay in the feedback loop, so that a desired negative feedback is not carried out. As a result, there are problems in that the operation for alternating signals is unstable and oscillates according to circumstances.

SUMMARY OF THE INVENTION

It is therefore an object of the present invention to provide an FDNR circuit, in which the distortion of the circuit forming an FDNR for use in an active filter circuit is small even if a large amplitude of signal is inputted under a low supply voltage in the FDNR, and which can carry out a stable operation.

In order to accomplish the aforementioned and other objects, according to one aspect of the present invention, a semiconductor integrated circuit is realized as an FDNR circuit comprising: a first operational amplifier having an inverted input and an output and; a first capacitor, one end of which is connected to the inverted input of the first operational amplifier; a first resistor, one end of which is connected to the inverted input of the first operational amplifier; a second resistor, one end of which is connected to the output end of the first operational amplifier, and the other end of which is connected to the other and of the first resistor; a second capacitor, one end of which is connected to the output end of the first operational amplifier, and the other end of which is connected to the other end of the first capacitor, the second capacitor having a greater capacity value than that of the first capacitor.

According to another aspect of the present invention, at least two resistors are connected to each other in series in place of the first resistor, and at least another resistor is provided, one terminal of which is grounded in an alternating current form, and the other end of which is connected to the connecting end at which the resistors are connected to each other in series.

According to the present invention, it is possible to decrease the amplitude at the output of the operational amplifier to operate at a low distortion even if the supply voltage is low, by selecting a greater capacity value of the second capacitor than that of the first capacitor.

In addition, according to the present invention, it is possible to convert a high resistance value caused by realizing an FDNR circuit, into a lower resistance value by the equivalent conversion, and to reduce the parasitic capacity which has caused problems on the layout area and the operation stability of the FDNR. In addition, if the distribution of the capacity values of the capacitors forming the FDNR is devised, it is possible to operate at a small distortion even if a high peak level signal is inputted under a low supply voltage.

BRIEF DESCRIPTION OF THE DRAWINGS

In the drawings:

FIG. 11 is a circuit diagram of the fifth preferred embodiment of an FDNR circuit according to the present invention;

FIG. 12 is a circuit diagram of the sixth preferred embodiment of an FDNR circuit according to the present invention;

FIG. 13 is a circuit diagram of the seventh preferred embodiment of a filter device according to the present invention:

FIGS. 14A through 14C are circuit diagrams, each illustrating the construction of a passive element model in a filter device according to the present invention;

FIG. 15 is a graph showing the transmission characteristic of the filter device in FIG. 13; and FIG. 16 is a block diagram illustrating a radio transmitter-receiver, to which the eighth preferred embodiment of a filter device according to the present invention is applied.

DESCRIPTION OF THE PREFERRED EMBODIMENT

Figures 5A, 5B, 5C:
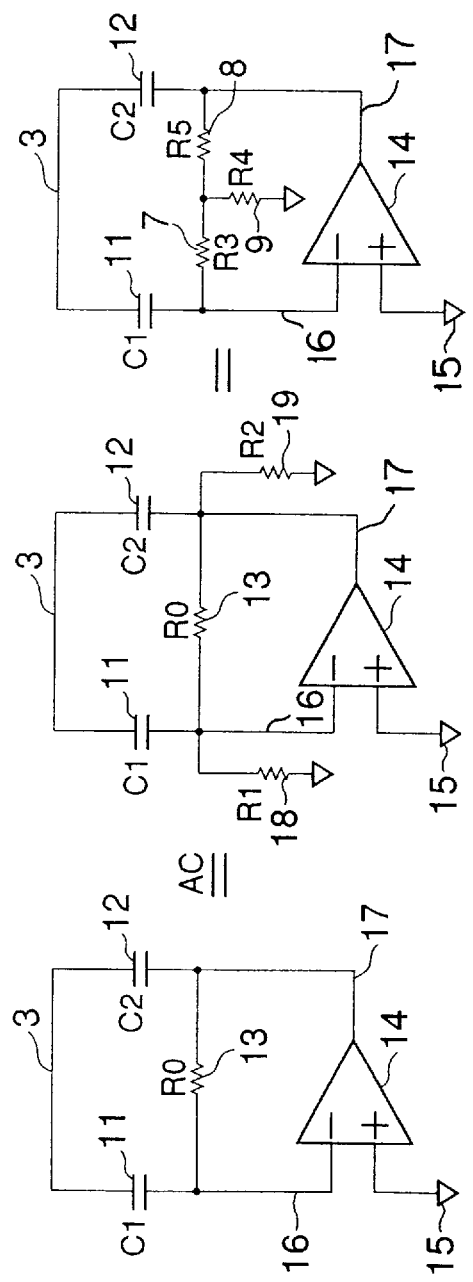
FIGS. 5A through 5C are circuit diagrams, each illustrating the equivalent conversion of a filter device according to the present invention.

The voltage gain of an output and of an operational amplifier for use in an FDNR circuit as shown in FIG. 5A, to a nodal point 3, to which both of capacitors C1 and C2 are connected, can be expressed by the following formula.

$$G=-A \cdot R0/[((1+A)/sC1)+R0] \tag{2}$$

wherein A is a DC gain of the operational amplifier. In particular, when $A \gg 1$, $G = -sC1 \cdot R0$. That is, when the capacity of the capacitor C1 is decreased, the gain decreases.

On the other hand, the conditions for the FDNR equivalent conversion of the FDNR value D and the equivalent capacity C can be expressed by the following formulae.

$$D=C1 \cdot C2R0 \tag{3}$$

$$C=C1+C2 \tag{4}$$

In order to set the FDNR value D and the equivalent capacity C to desired set values, there is a relationship in that the capacity C1 is inversely proportional to the capacity C2. From these two conditions as set forth above, it is possible to decrease the amplitude at the output of the operational amplifier by setting the capacity C1 as small as possible and by setting the capacity C2 as large as possible in order to restrain the signal gain, so that it is possible reduce the distortion of the signal at the output of the operational amplifier.

Figure 6:
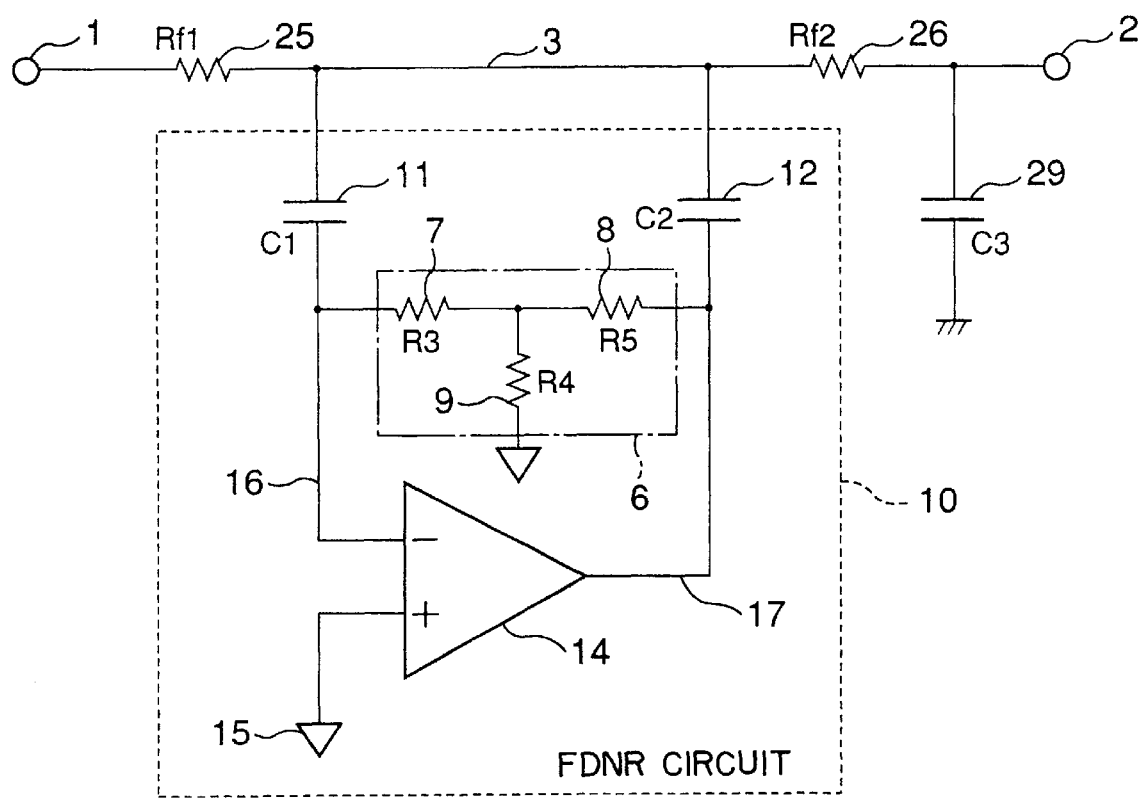
FIG. 6 is a circuit diagram of the first preferred embodiment of a filter device having an FDNR circuit according to the present invention.

FIG. 6 is a circuit diagram of the first preferred embodiment of an active low-pass filter using an FDNR, according to the present invention. This figure illustrates a tertiary low-pass filter. This is realized by an active element and an RC by carrying out the equivalent conversion from a ladder-type filter of LCR as described above using FIG. 3. Since the details thereof have been described in FIG. 2, only different points will be described below.

Figure 1:
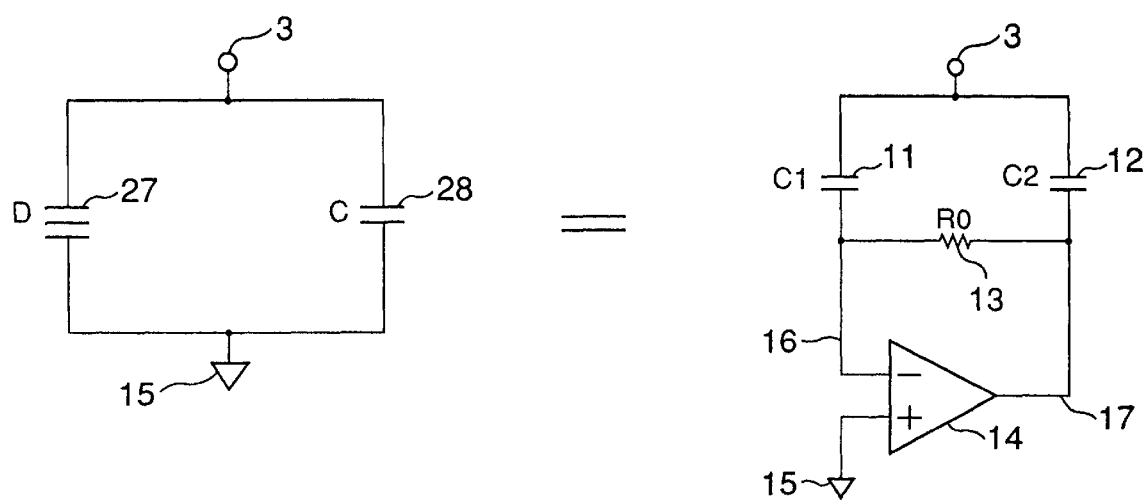
FIG. 1 is a circuit diagram illustrating a typical FDNR conversion.
Figure 2:
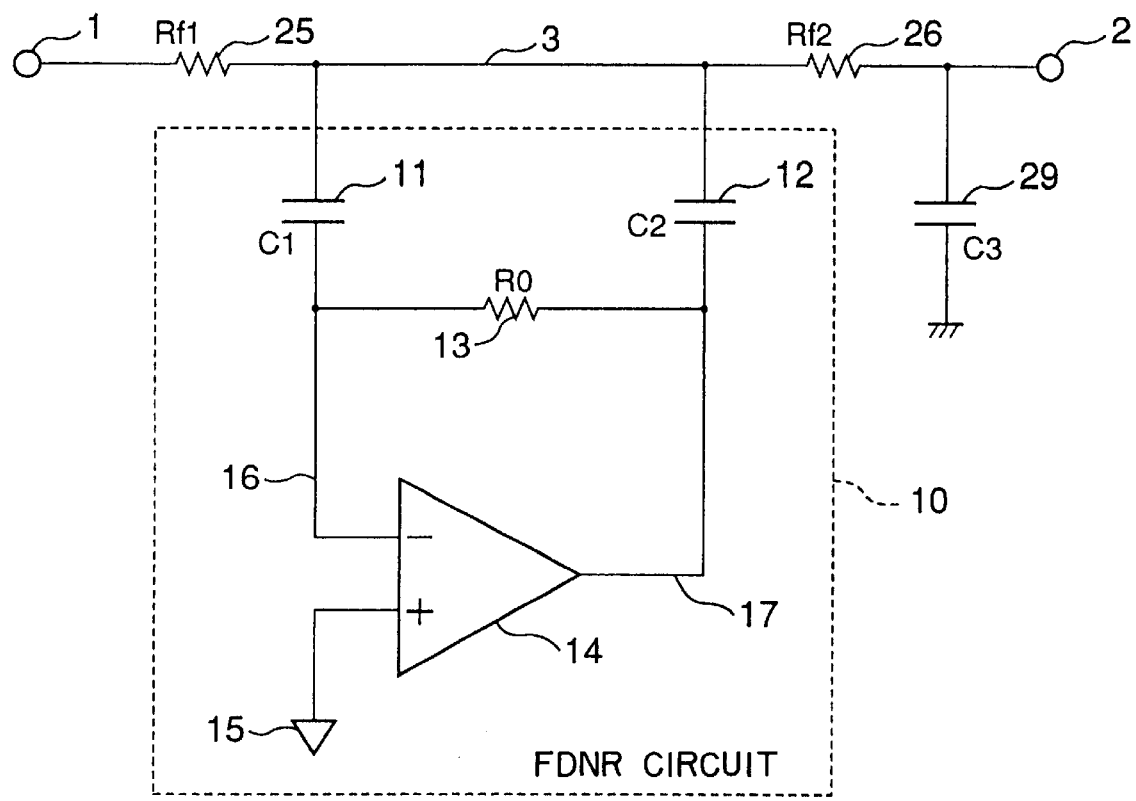
FIG. 2 is a circuit diagram illustrating a conventional filter device using an FDNR circuit.
Figure 3A:
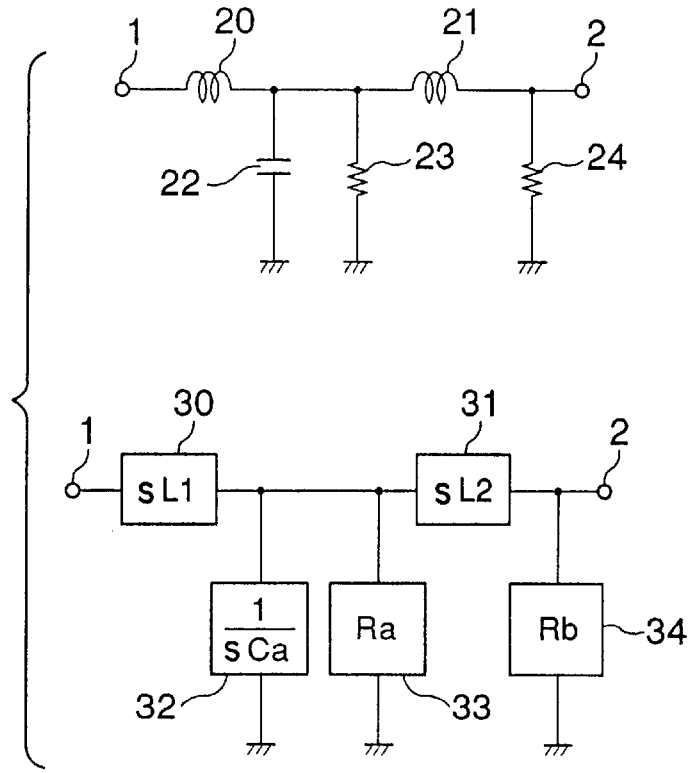
FIGS. 3A and 3B are circuit diagrams illustrating the equivalent conversion in a tertiary low-pass filter.
Figure 3B:
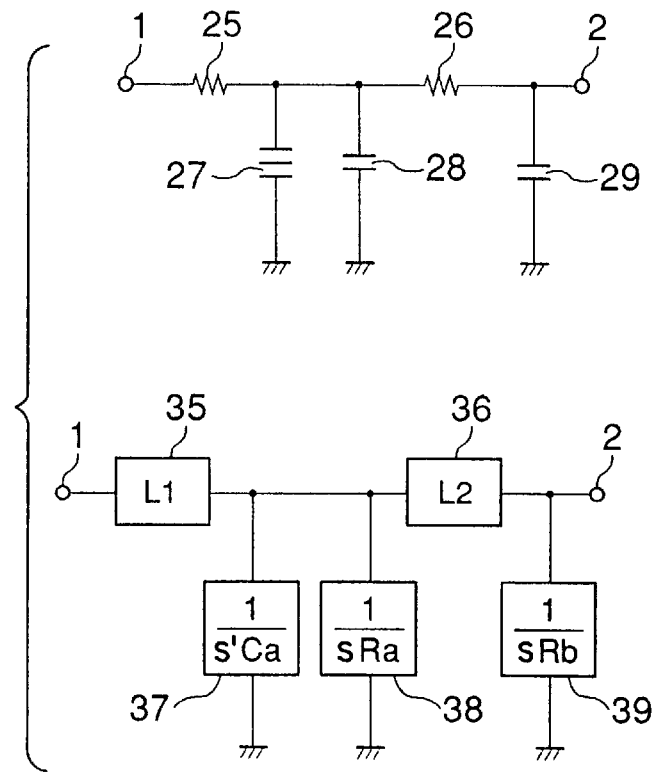

In FIG. 6, the different point from the circuit shown in FIG. 2 is the detailed construction of an FDNR circuit 10. That is, while the FDNR circuit 10 in FIG. 2 is provided with the first resistor 13 between one ends of the first and second capacitors 11 and 12, the FDNR circuit 10 in FIG. 6 is provided with an impedance element 6 between one ends of the first and second capacitors 11 and 12 in place of the first resistor 13. This impedance element 6 comprises resistors 7 and 8 which are connected to each other in series between the one ends of the first and second capacitors 11 and 12, and a resistor 9, one end of which is connected to the connecting point of the resistors 7 and 8, and the other end of which is grounded.

Figure 7:
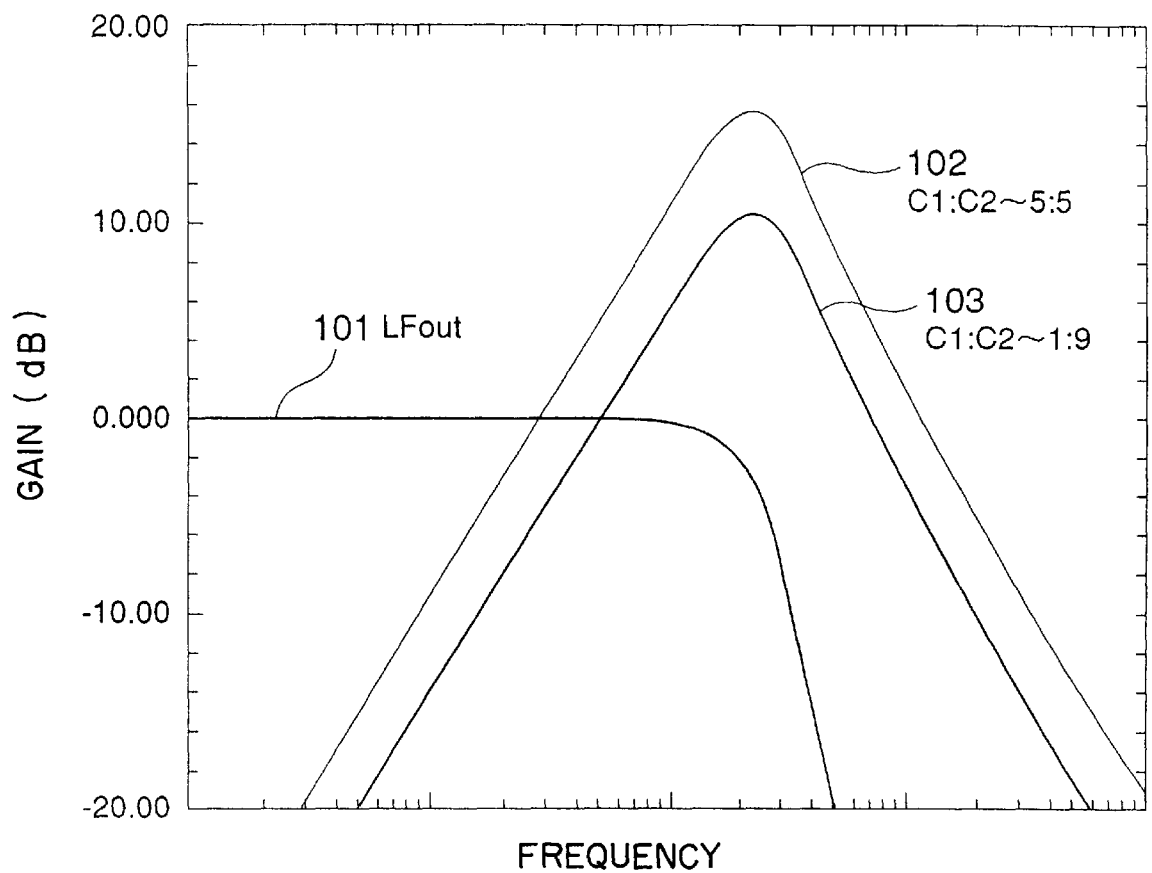
FIG. 7 is a graph illustrating the equivalent conversion of a filter device according to the present invention.

FIG. 7 shows the frequency characteristics of the output voltages at an output terminal 2 of the tertiary Butterworth low-pass filter in the first preferred embodiment as shown in FIG. 6 and at an output end 17 of an operational amplifier.

These characteristics are designed at a cut-off frequency of 200 kHz (−3 dB down) so that the ratio (C1:C2) of capacities C1 and C2 is 1:9 in the example of the present invention. It was found that although the signal output at the output end of the operational amplifier is the maximum at near the cut-off frequency, it is smaller, by about 6 dB, than one having a ratio of capacities C1 and C2 being 5:5, i.e. the amplitude is about half.

As show in FIG. 5B, resistors 18 and 19 having resistance values R1 and R2 which are smaller than R0, for example, about one-tenth as large as R0, are provided between both ends of the resistor 13 (between the input and output terminals of the operational amplifier). An inverted input 16 of the operational amplifier 14 is a virtual earth in an alternating current form, and if the output of the operational amplifier 14 has a sufficient driving capability, the condition is substantially the same in the alternating current form even if the resistors 18 and 19 (R1 and R2) are inserted. Then, the newly inserted resistors 16 and 19 (R1 and R2) and the feedback resistor 13 (R0) are considered to be a Δ-shaped resistor network to be replaced with a T-shaped network using the Δ-T conversion.

Using the numbers of elements in FIG. 5C, the relationship of equivalent conversion can be expressed by the following formula.

$$R3 = R1 \cdot R0/(R0+R1+R2) \quad (5)$$

$$R4 = R1 \cdot R2/(R0+R1+R2) \quad (6)$$

$$R5 = R2 \cdot R0/(R0+R1+R2) \quad (7)$$

As the results of these conversions, the newly derived resistance values R3 and R5 of the resistors 7 and 8 can be decreased to approximately one-tenth as large as the resistance value R0 of the feedback resistor 13, and the resistance value R4 of the resistor 9 can also be decreased to approximately one-tenth as large as the resistance values R1 and R2 of the resistors 18 and 19. Thus, the parasitic capacity of the resistor can be reduced to approximately one-tenth to contribute to the stable operation.

Figure 8:
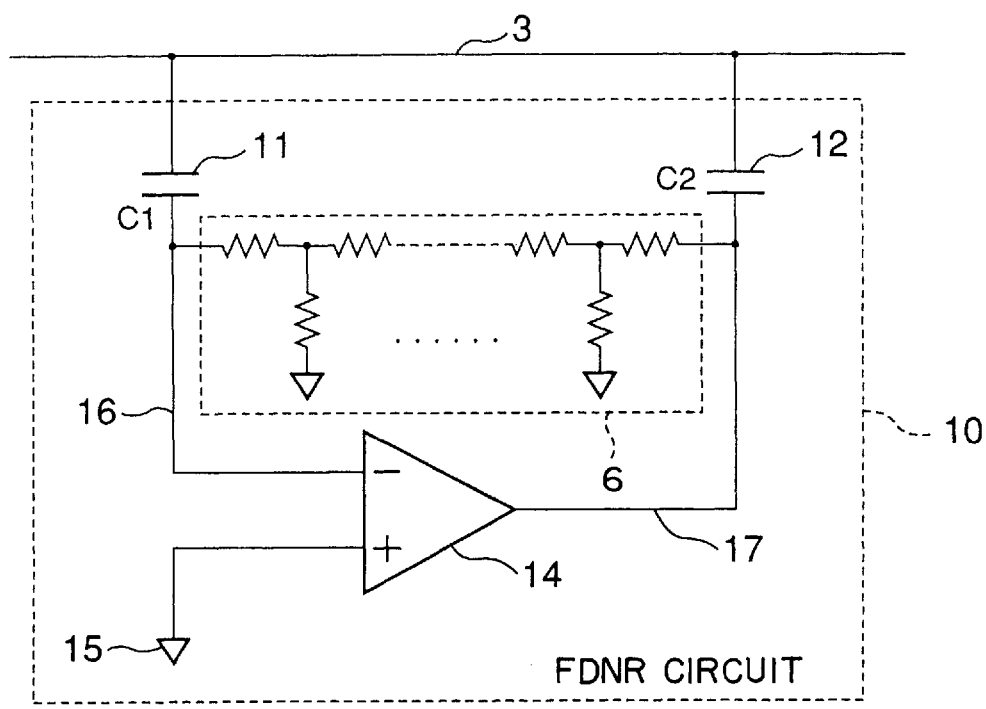
FIG. 8 is a circuit diagram of the second preferred embodiment of an FDNR circuit according to the present invention.

FIG. 8 illustrates the second preferred embodiment of an FDMR circuit according to the present invention. While the feedback resistor of the operational amplifier 14 has comprised the network of three resistors in FIG. 6, it has a multistage ladder-type construction in addition thereto in this embodiment, so that it is possible to further reduce the sum total of resistors. In addition, it is also possible to adjust the DC loop gain of the FDNR circuit by providing the multistage ladder-type construction.

Figure 9:
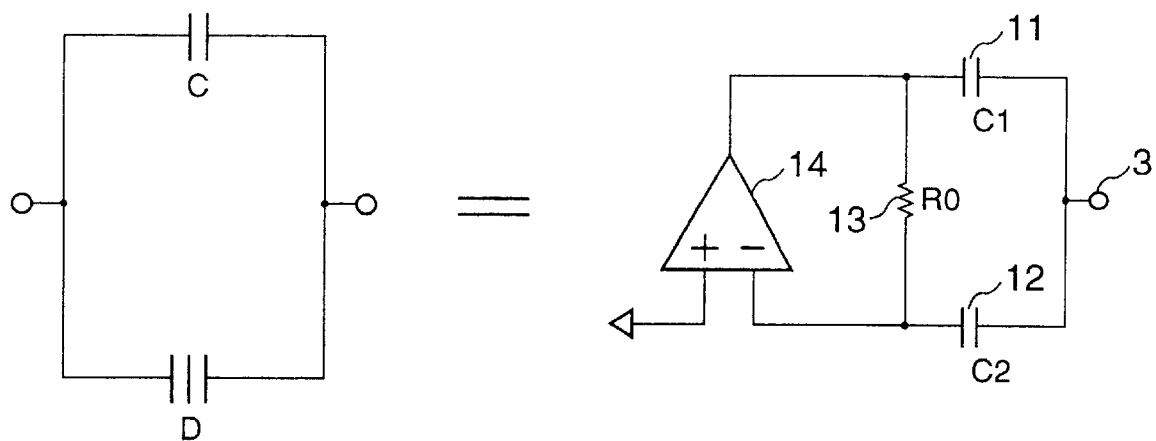
FIG. 9 is circuit diagram illustrating the equivalent conversion of the third preferred embodiment of an FDNR circuit according to the present invention.

FIG. 9 illustrates the third preferred embodiment of an FDNR circuit according to the present invention. While the immitance having a single grounded end has been realized in FIG. 6, the immitance wherein both terminals are not grounded is realized in this embodiment. The capacity C1 of a capacitor 11 is set to be greater than the capacity C2 of the capacitor 12, so that it is possible to restrain the signal level of the output terminal of the operational amplifier. Furthermore, the conversion relationship from the immitance to the FDNR is the same as that in the circuit in the first preferred embodiment as shown in FIG. 6.

Figure 10:
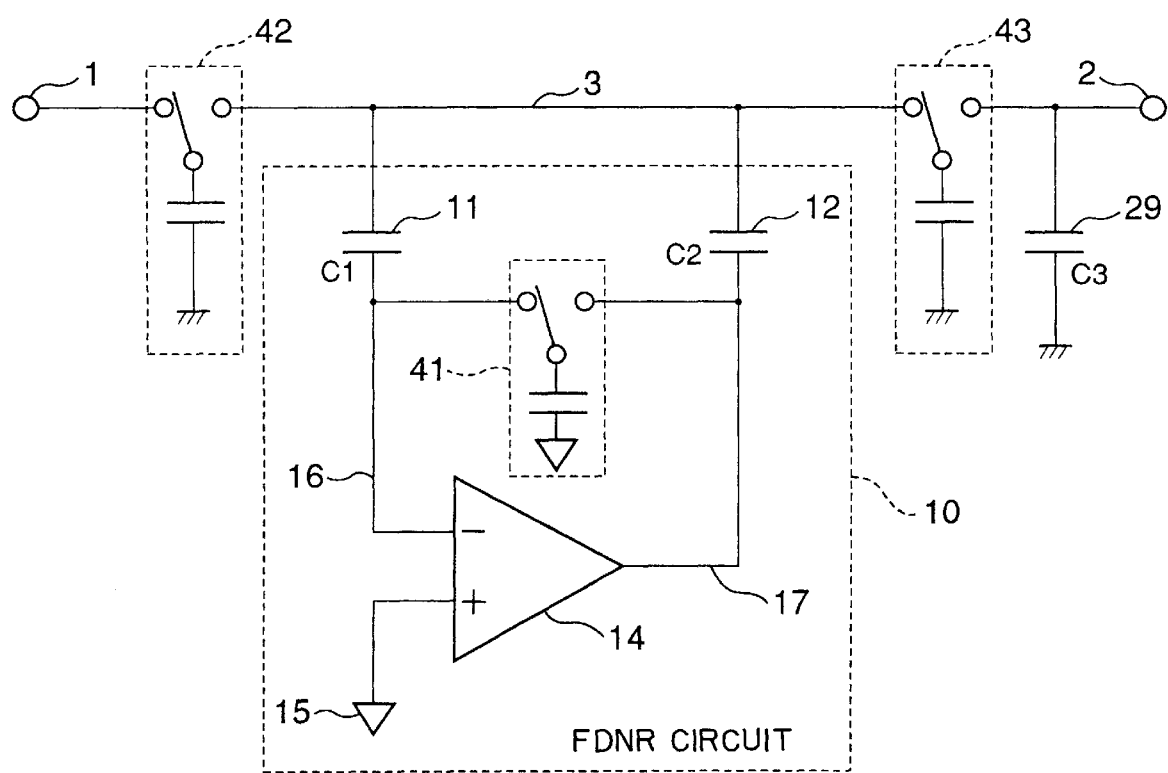
FIG. 10 is a circuit diagram of the fourth preferred embodiment of a filter device according to the present invention.

FIG. 10 illustrates the fourth preferred embodiment wherein the resistor 13, which is used in the FDNR circuit and the filter circuit using the same, is replaced with a switched capacitor 41. In FIG. 10, a switched capacitor 42 is provided between the input terminal 1 and the FDNR circuit 10, and a switched capacitor 43 is provided between the FDNR circuit 10 and the output terminal 2.

Thus, it is possible to realize a large resistance by a small capacity and a switching element, so that it is possible to decrease the occupied area in an integrated circuit. In addition, since the accuracy depends upon the ratio of capacities, it is possible to realize a more accurate transmission characteristic than that of the construction comprising resistors and capacitors. In addition, since the parasitic capacity can be decreased by realizing the feedback resistor forming the FDNR circuit by the switched capacitor, the stability can be enhanced.

FIG. 11 is a circuit diagram of the fifth preferred embodiment of an FDNR circuit according to the present invention. In the first preferred embodiment of the filter device as shown in FIG. 6, it is required to apply a bias suitable for the operation of the operational amplifier 14, to the earth terminal 15 in a case where the operational amplifier 14 is operated by a single power supply. For that reason, it is required to maintain the state wherein the terminal of the non-inverted input 16 of the operational amplifier 14 or the earth end 15 of the feedback resistor network is grounded in the alternating current form while applying a constant direct-current voltage thereto.

As a method for realizing this, an external voltage source 55 having a sufficiently low output impedance is usually prepared. However, in a case where this is realized by a passive element due to the restrictions such as consumed power and circuit scale, this can also be realized by a circuit 56 wherein an earth terminal is voltage-divided from a power supply by resistors. In order to decrease an alternating impedance with respect to the treated frequency band, the connecting end of the voltage-dividing resistor 55 may be grounded via a capacitor. In addition, in the feedback resistor network in the FDNR circuit, the resistor having a single grounded end may be replaced with two resistors 57 and 58, one end of one resistor 57 of which is connected to the power supply, the other end of the one resistor 57 being connected to the connecting point of the resistors 7 and 8, one end of the other resistor 58 being connected to the connecting point of the resistors 7 and 8, so that it is possible to set a direct-current potential of the resistor network without changing the loop gain.

Figure 4:
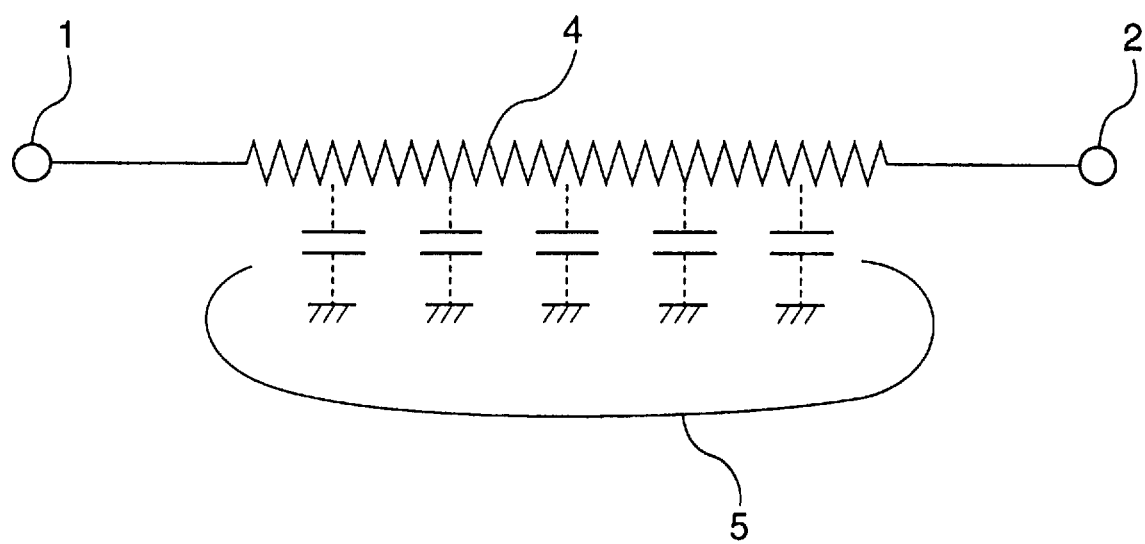
FIG. 4 is a circuit diagram illustrating parasitic capacities distributed in a resistor.

FIG. 12 illustrates the sixth preferred embodiment of the present invention. In this embodiment, the resistor, which is connected between the connecting point of the resistors 6 connected in series and the grounding point in the alternating current form as shown in FIG. 4, is replaced with a resistor having ends connected to the power supply and the GND similar to FIG. 11, so that it is not required to any external powers for realizing the alternating grounding.

FIG. 13 illustrates the seventh preferred embodiment of the present invention. In FIG. 13, a passive element circuit 50 is provided between the input terminal 1 and the output terminal 2 in parallel to the FDNR circuit 10. This passive element circuit 50 comprises: a resistor 51, one end of which is connected between the input terminal 1 and the output terminal 2, and the other end of which is connected to a capacitor 11; a resistor 52, which is connected in parallel to the resistor 51, one end of which is connected between the terminals 1 and 2, and the other end of which is connected to a second capacitor 12; and 8 resistor 53 connected in series between the one ends of the resistors 51 and 52. When a sufficient attenuated quantity in the cut-off region of the filter can not be obtained, a notch is often inserted into a certain frequency to ensure the required attenuated quantity if necessary.

FIG. 14 illustrates the constructions of passive element models which can obtain the transmission characteristic wherein a notch is added to a filter circuit having the LPF characteristic. FIG. 15 shows the LPF characteristic to which the notch is added. As shown in FIG. 14A, when an inductance 45 is connected in series to the capacitor 22, one end of which is grounded, the impedance to ground is extremely small at the series resonance frequency fo of the capacitor 22 and the inductance 45. For that reason, the passing characteristic near the resonance frequency fo extremely approaches zero. As a result, as shown in FIG. 11, in the transmission characteristic between the input and output of this filter circuit with respect to frequency, a characteristic 201, to which a notch 203 having a transmission index extremely approximating zero was added at the series resonance frequency fo, was observed in place of the previous filter's frequency characteristic 202, to which the inductance 45 is applied. When a large attenuated quantity is required at a frequency at which a sufficiently attenuated quantity has not yet been obtained in the LPF's monotone attenuated region, if the series resonance frequency fo is added to this frequency, it is possible to ensure the required attenuated quantity without increasing the filter's degree. From this model, the conversion, wherein each impedance is subtracted by s, is performed (FIG. 14B).

In FIG. 14B, a passive element circuit 46 is provided between the input terminal 1 and the output terminal 2 in series to the FDNR circuit. The passive element circuit 46 comprises a resistor 47 connected in series to the immitance 27 obtained by the equivalent conversion of the FDNR circuit, and resistors 25 and 26 provided between the input terminal 1 and the output terminal 2, the resistor 47 being also connected to the connecting point of the resistors 25 and 26. Furthermore, FIG. 14C illustrates that the FDNR circuit 10 in FIG. 13 is equivalently converted to be expressed by the immitance 27 end the capacitor 28.

In the case of an LFP, since the frequency fo of the notch inserted into the rejection band is usually higher than the cut-off frequency fc of the LPF, the resistance value of the resistor connected in series to the FDNR circuit is extremely smaller than the resistance value of the resistor provided on the signal line. For example, if it is assumed that the resistor provided on the signal line has a resistance value of several kΩ, the resistance value in the FDNR circuit is often converted into an extremely small value which is approximately several through tens Ω. In a case where a resistor having such a small resistant value is realized in an LSI, it is not possible to accurately rately set the frequency of the notch to a predetermined value due to the influences of the wiring resistance and of the resistance at the contact between the wiring and the element. Therefore, it is possible to convert all the resistors into the same order of resistors by equivalently converting the T-shaped resistor network into the Δ-shaped resistor network, so that it is possible to solve the problem in that the notch's frequency can not be set to a predetermined value due to the wiring resistance and the contact resistance. The converting method is obtained by inversely using the relationships (5) through (7) as mentioned above.

While a set of FDNR circuits have been used in the aforementioned preferred embodiments, it is possible to realize a higher degree filter circuit by preparing and connecting a plurality of FDNR circuits in series.

FIG. 16 is a block diagram illustrating the eight preferred embodiment wherein a low-pass filter (LPF) using an electronic circuit (FDNR circuit) of the present invention is applied to a radio transmitter-receiver.

In FIG. 16, a radio transmitter-receiver 60 comprises an antenna 61 for transmitting or receiving a radio frequency (RF) signal, a switch 62 for carrying out the switching between transmission and receiving, first frequency converting means 63 for direct-converting the RF signal inputted via the antenna 61, into a base band (base frequency) signal, a first low-pass filter (LPF) 64 for channel-selecting the base band signal obtained by the direct-conversion, a digital signal processing section 65 for analog-to-digital (A/D) converting the received RF signal and for digital-to-analog (D/A) converting the base band signal, an LPF 66 for removing the quantization noise of the D/A converted base band signal, and second frequency converting means 67 for converting the base band signal into an RF signal.

As blocks having advantageous effects when being applied to the radio transmitter-receiver as shown in FIG. 12, there are two things: one of which is a filter for channel-selecting a base band signal obtained by the direct frequency conversion of an RF signal inputted from an antenna in a receiver (RX), and the other of which is a filter for removing quantization noise and so forth after the D/A conversion of a base band modulated signal immediately before up-converting a base band signal outputted from a digital signal processing section in a transmitter (TX) into an RF. When a DC offset occurs in these filters, for example, in the case of a signal containing a frequency component up to the DC such as a QPSK modulated signal, it is not possible to discriminate this modulated signal from the DC offset signal in the receiver, so that it is riot possible to receive it. In addition, this DC component serves as a carrier leak after the frequency conversion in the transmitter. Since no DC offset occurs in the LPF using the FDNR circuit according to the present invention, when this LPF is used for a radio transmitter-receiver, it is possible to solve the aforementioned problem caused by the DC offset of the filter.

What is claimed is:

1. An electronic circuit comprising:
   an operational amplifier having an inverted input and an output end;
   a first capacitor, one end of which is connected to said inverted input of said operational amplifier:
   a second capacitor one end of which is connected to said output end of said operational amplifier, and the other end of which is connected to the other end of said first capacitor;
   first through number n of resistors (n ≧2) connected to each other in series to be connected to said inverted input and said output end of said operational amplifier; and
   at least one resistor, one end of which is connected to a connecting point between the adjacent resistors of said first through number n resistors, and the other end of which is grounded at least in an alternating current form.

2. An electronic circuit as set forth in claim 1, wherein said capacity value of said second capacitor is greater than that of said first capacitor.

3. A filter device comprising an electronic circuit as set forth in claim 1, a plurality of resistor elements, and a capacitor element.

4. A radio transmitter-receiver comprising a filter device as set forth in claim 3: wherein said radio transmitter-receiver comprises
   first frequency converting means for direct-converting a radio frequency (RF) signal inputted via an antenna, into a base band signal;
   a first low-pass filter (LPF) for channel-selecting the base band signal obtained by direct-conversion;

digital signal processing for analog-to-digital (A/D) converting the received RF signal and for digital-to-analog (D/A) converting the base band signal;

a second LPF for removing the quantization noise of the D/A converted base band signal; and second frequency converting means for converting the base band signal into an RF signal for a transmission.

5. A filter device comprising:

at least one first impedance element, a switching element for controlling the charge and discharge of a capacitor, at least one second impedance element having a capacitor component; and an electronic circuit, said electronic circuit comprising:
an inverting amplifier having an inverted input terminal, a fixed non-inverted input terminal and an output terminal;
a first capacitor element, one end of which is connected to said inverted input terminal of said inverting amplifier;
an impedance circuit, one end of which is connected to said inverted input terminal of said inverting amplifier, and the other end of which is connected to said output terminal of said inverting amplifier;
a second capacitor element having a greater capacity value than that of said first capacitor element, one end of said second capacitor element being connected to said output terminal of said inverting amplifier, and the other end of said second capacitor element being connected to the other end of said first capacitor element; and
an input terminal and an output terminal connected in series with each other, wherein said first capacitor element is connected in parallel to said input terminal, and said second capacitor element is connected in parallel to said output terminal.

6. An electronic circuit comprising:

an inverting amplifier having an inverted input terminal, a fixed non-inverted input terminal and an output terminal;

a first capacitor element, one end of which is connected to said inverted input terminal of said inverting amplifier;

an impedance circuit, one end of which is connected to said inverted input terminal of said inverting amplifier, and the other end of which is connected to said output terminal of said inverting amplifier;

a second capacitor element having a greater capacity value than that of said first capacitor element, one end of said second capacitor element being connected to said output terminal of said inverting amplifier, and the other end of said second capacitor element being connected to the other end of said first capacitor element; and an input terminal and an output terminal connected in series with each other, wherein said first capacitor element is connected in parallel to said input terminal, and said second capacitor element is connected in parallel to said output terminal wherein said impedance circuit comprises:

switching means having three terminals in which first and second terminals are respectively connected to said first and second capacitor elements, and a third terminal having a movable contact; and a third capacitor, one end of which is connected to said third terminal, and the other end of which is connected to a predetermined potential at the ground level;

wherein said switching means reciprocally changes over a connection of said first and third terminals and a connection of said second and third terminals.

* * * * *